(12) United States Patent
Misawa et al.

(10) Patent No.: US 11,264,779 B2
(45) Date of Patent: Mar. 1, 2022

(54) OPTICAL MODULE

(71) Applicant: Sumitomo Electric Industries, Ltd., Osaka (JP)

(72) Inventors: Taichi Misawa, Osaka (JP); Tomoya Saeki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 21 days.

(21) Appl. No.: 16/771,614

(22) PCT Filed: Dec. 7, 2018

(86) PCT No.: PCT/JP2018/045153
§ 371 (c)(1),
(2) Date: Jun. 10, 2020

(87) PCT Pub. No.: WO2019/117044
PCT Pub. Date: Jun. 20, 2019

(65) Prior Publication Data
US 2020/0303897 A1 Sep. 24, 2020

(30) Foreign Application Priority Data
Dec. 12, 2017 (JP) .............................. JP2017-237770

(51) Int. Cl.
*H01S 5/024* (2006.01)
*H01S 5/02345* (2021.01)

(52) U.S. Cl.
CPC ...... *H01S 5/02438* (2013.01); *H01S 5/02345* (2021.01)

(58) Field of Classification Search
CPC ............. H01S 5/02438; H01S 5/02345; H01S 5/1085; H01S 5/024; H01S 5/02251; H01S 5/02446
(Continued)

(56) References Cited

U.S. PATENT DOCUMENTS 6,667,997 B2 * 12/2003 Nasu .................... G02B 6/4246
372/32
9,853,414 B2 * 12/2017 Wang .................... H01S 5/0235
(Continued)

FOREIGN PATENT DOCUMENTS

| JP | 2003-110190 A | 4/2003 |
| JP | 2008-166730 A | 7/2008 |
| JP | 2016-115721 | 6/2016 |

*Primary Examiner* — Tuan N Nguyen
(74) *Attorney, Agent, or Firm* — Baker Botts L.L.P.; Michael A. Sartori

(57) ABSTRACT

The optical module includes: a housing having first and second end walls and a pair of side walls; a semiconductor laser element; a first TEC; a wavelength locker unit including an optical splitting component and an etalon filter; and a second TEC. The second end wall is provided with a feedthrough. The pair of side walls is not provided with an external connection terminal. The second TEC is disposed between the first TEC and the second end wall and has: a first substrate thermally coupled to a bottom surface of the housing; a second substrate thermally coupled to the etalon filter; and a heat transfer part that transfers heat. The optical module further includes a wiring pattern that is arranged side by side with the heat transfer part and that supplies electric power to the first TEC from the feedthrough.

3 Claims, 7 Drawing Sheets

(58) Field of Classification Search
USPC .................................................. 372/34, 36
See application file for complete search history.

(56) References Cited

U.S. PATENT DOCUMENTS

| | | | |
|---|---|---|---|
| 10,644,478 B2* | 5/2020 | Tomita | H01S 5/022 |
| 2003/0081309 A1 | 5/2003 | Nishi et al. | |
| 2009/0010652 A1 | 1/2009 | Iwafuji | |
| 2015/0162723 A1* | 6/2015 | Daiber | H01S 5/02216 |
| | | | 372/20 |
| 2015/0162990 A1 | 6/2015 | Daiber et al. | |
| 2016/0142147 A1* | 5/2016 | Daiber | G02B 6/4215 |
| | | | 398/183 |
| 2017/0184802 A1 | 6/2017 | Saeki et al. | |

* cited by examiner

OPTICAL MODULE

TECHNICAL FIELD

One aspect of the present disclosure relates to an optical module.

This application claims priority based on Japanese Patent Application No. 2017-237770 filed on Dec. 12, 2017, the content of which is incorporated by reference herein in its entirety.

BACKGROUND ART

Patent Literature 1 discloses an optical module including a wavelength tunable semiconductor laser element. This optical module includes a wavelength locker unit that detects the wavelength of a laser beam output from the semiconductor laser element, a temperature control device that controls the temperature of the semiconductor laser element, and another temperature control device that controls the temperature of the wavelength locker unit. Electric power is supplied to each temperature control device via a feedthrough provided in the side wall of a housing.

CITATION LIST

Patent Literature

Patent Literature 1: Japanese Unexamined Patent Publication No. 2016-115721

SUMMARY OF INVENTION

An optical module according to an embodiment includes: a housing having first and second end walls arranged in a first direction and intersecting with the first direction, and a pair of side walls along the first direction; a semiconductor laser element housed in the housing; a first temperature control device equipped with the semiconductor laser element and configured to control a temperature of the semiconductor laser element; a wavelength locker unit including an optical splitting component and an etalon filter, the optical splitting component and the etalon filter being optically coupled to the semiconductor laser element in the housing; and a second temperature control device equipped with the wavelength locker unit and configured to control a temperature of the etalon filter. The first end wall is provided with an optical output port for outputting a laser beam from the semiconductor laser element to an outside of the housing. The second end wall is provided with a feedthrough having an external connection terminal, the feedthrough being configured to electrically connect an inside of the housing and an outside of the housing. The pair of side walls is not provided with an external connection terminal. The second temperature control device is disposed between the first temperature control device and the second end wall in the first direction, and includes a first substrate thermally coupled to a bottom surface of the housing, a second substrate thermally coupled to the etalon filter, and a heat transfer part configured to transfer heat between the first substrate and the second substrate. The optical module is further provided with a wiring pattern which is arranged side by side with the heat transfer part in a second direction intersecting with the first direction, and which supplies electric power from the feedthrough to the first temperature control device.

DESCRIPTION OF EMBODIMENTS

Figure 1:
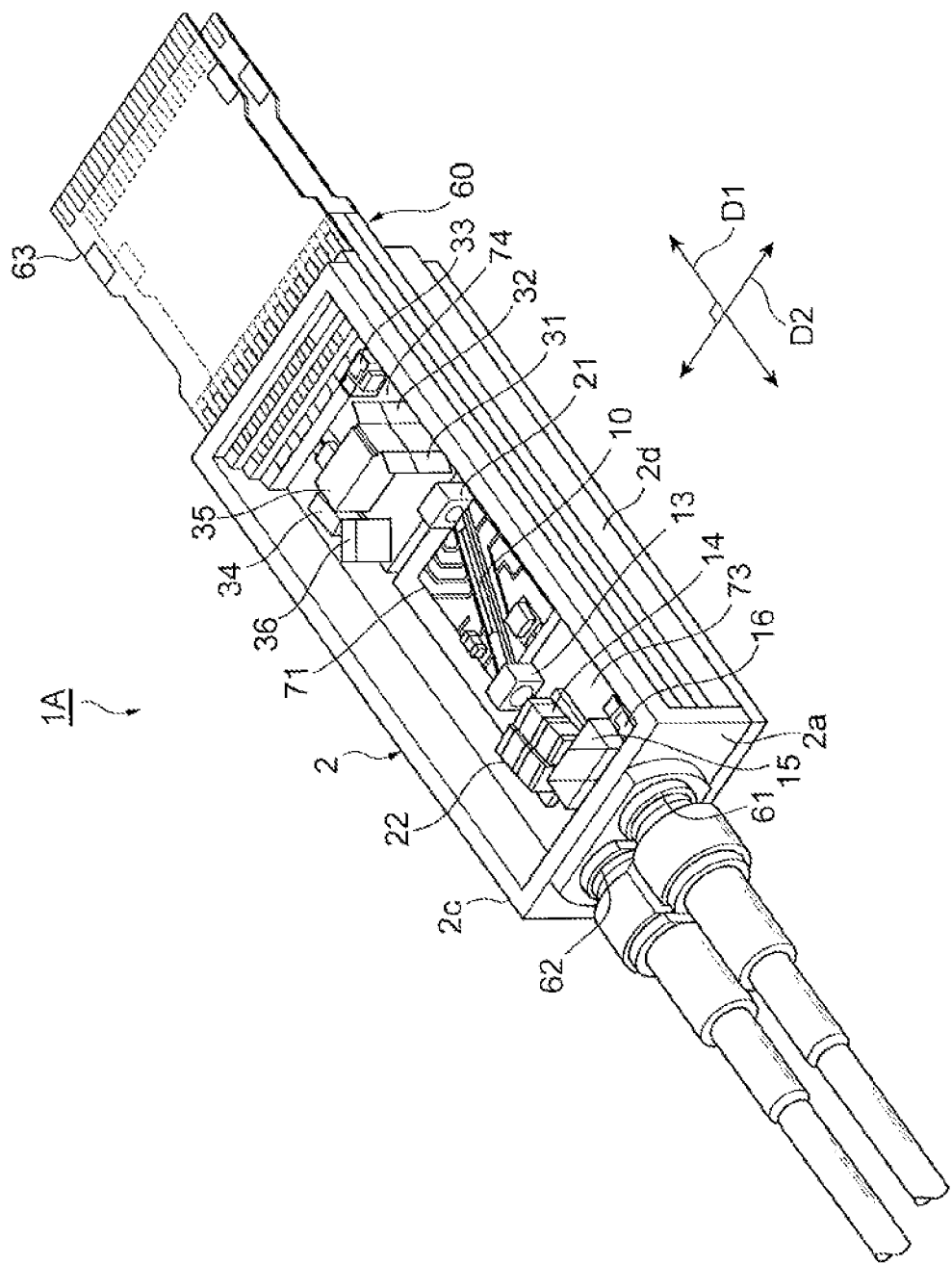
FIG. 1 is a perspective view showing an internal structure of an optical module according to an embodiment.

Problems to be Solved by Present Disclosure

An optical module used in an optical communication device has a built-in semiconductor laser element. In order to precisely control the wavelength of a laser beam output from the semiconductor laser element to a desired wavelength, the optical module further includes a wavelength locker unit that detects a difference between the wavelength of the laser beam output from the semiconductor laser element and the desired wavelength. Then, in order to bring the detected wavelength closer to the desired wavelength, the temperature of the semiconductor laser element is adjusted using a temperature control device (thermo-electric controller (TEC)). Further, the wavelength locker unit has an etalon filter. Since the grid wavelength of the etalon filter varies with temperature, the temperature of the etalon filter is adjusted using another TEC in order to keep the grid wavelength of the etalon filter constant or to shift the grid wavelength of the etalon filter.

Effects of Present Disclosure

The present disclosure can provide an optical module which includes a TEC for adjusting the temperature of a semiconductor laser element and another TEC for adjusting the temperature of an etalon filter, and which can be downsized.

Description of Embodiments

First, the details of the embodiment of the present disclosure will be listed and described. An optical module according to an embodiment includes: a housing having first and second end walls arranged in a first direction and intersecting with the first direction, and a pair of side walls along the first direction; a semiconductor laser element housed in the housing; a first temperature control device equipped with the semiconductor laser element and configured to control a temperature of the semiconductor laser element; a wavelength locker unit including an optical splitting component and an etalon filter, the optical splitting component and the etalon filter being optically coupled to the semiconductor laser element in the housing; and a second temperature control device equipped with the wavelength locker unit and configured to control a temperature of the etalon filter. The first end wall is provided with an optical output port for outputting a laser beam from the semiconductor laser element to an outside of the housing. The second end wall is provided with a feedthrough having an external connection terminal, the feedthrough being configured to electrically connect an inside of the housing and an outside of the housing. The pair of side walls is not provided with an external connection terminal. The second temperature control device is disposed between the first temperature control device and the second end wall in the first direction, and includes a first substrate thermally coupled to a bottom surface of the housing, a second substrate thermally coupled to the etalon filter, and a heat transfer part configured to transfer heat between the first substrate and the second substrate. The optical module is further provided with a wiring pattern which is arranged side by side with the heat transfer part in a second direction intersecting with the first direction, and which supplies electric power from the feedthrough to the first temperature control device.

In this optical module, the second end wall is provided with a feedthrough having an external connection terminal for electrically connecting the inside of the housing to the outside of the housing, and the pair of side walls has no external connection terminal provided thereon. Therefore, the size of the optical module in the second direction (width direction) can be reduced. In addition, when the second TEC is disposed between the first TEC and the second end wall as described above, a supply of electric power from the feedthrough provided on the second end wall to the first TEC is a problem to be addressed. Commonly, the feedthrough is connected to the TEC via a bonding wire. In the above configuration, if the bonding wire is extended across the second TEC, the bonding wire may become too long, and therefore, a failure such as a short circuit is likely to occur. In view of this, in the above optical module, the wiring pattern for supplying electric power from the feedthrough to the first TEC is arranged side by side with the heat transfer part of the second TEC in the second direction. Due to the wiring pattern provided as described above, electric power can be suitably supplied from the feedthrough to the first TEC. Furthermore, the reliability of the optical module can be improved, as compared with the case where the bonding wire is extended across the second TEC.

In the above optical module, the wiring pattern may be provided on the first substrate. Accordingly, the wiring pattern can be easily arranged side by side with the heat transfer part.

The optical module described above may further include a carrier member disposed between the second TEC and the wavelength locker unit and equipped with the wavelength locker unit, wherein the carrier member may have a first region formed on the heat transfer part and a second region facing the wiring pattern, and the etalon filter may be disposed in the first region, while the optical splitting component may be disposed in the second region. Due to the configuration in which the etalon filter that requires temperature control is mounted on the heat transfer part and the optical splitting component that does not require temperature control is mounted in the region facing the wiring pattern as described above, the optical module can be further downsized by efficiently arranging the components of the wavelength locker unit.

In the above optical module, the optical splitting component may be optically coupled to a rear surface of the semiconductor laser element, and the rear surface of the semiconductor laser element may be arranged side by side with the second region in the first direction. With this configuration, the rear surface of the semiconductor laser element and the optical splitting component in the wavelength locker unit can be directly optically coupled, which can reduce the number of optical components of the wavelength locker unit. Thus, this configuration can contribute to further reduction in size of the optical module.

In the above optical module, the feedthrough may have a plurality of stepped surfaces inside the housing, and a stepped surface included in the plurality of stepped surfaces and closest to the bottom surface of the housing may be provided with only a terminal for supplying electric power to the first and second TECs. With this configuration, the wiring pattern provided on the first substrate of the second TEC can be brought closer to the terminal of the feedthrough in the height direction, which can facilitate the electric connection (wire bonding) between them.

Details of Embodiment

A specific example of the optical module according to the embodiment of the present disclosure will be described below with reference to the drawings. It should be noted that the present disclosure is not limited to the description below, and is intended to include all modifications within the spirit and scope as defined by the appended claims and their equivalents. In the following description, the same elements are denoted by the same reference numerals, and redundant description is omitted.

Figure 2:
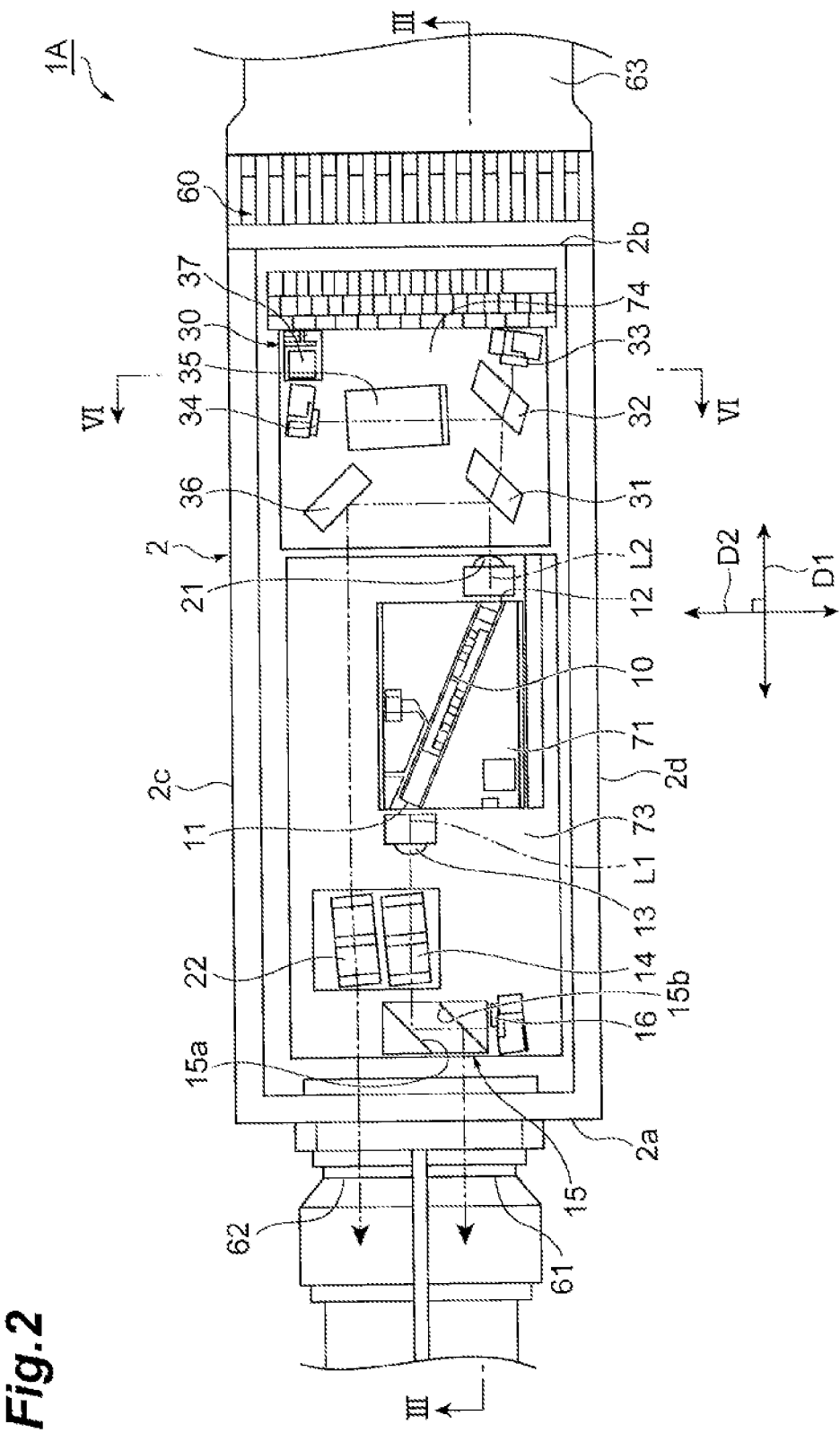
FIG. 2 is a plan view showing the internal structure of the optical module.
Figure 3:
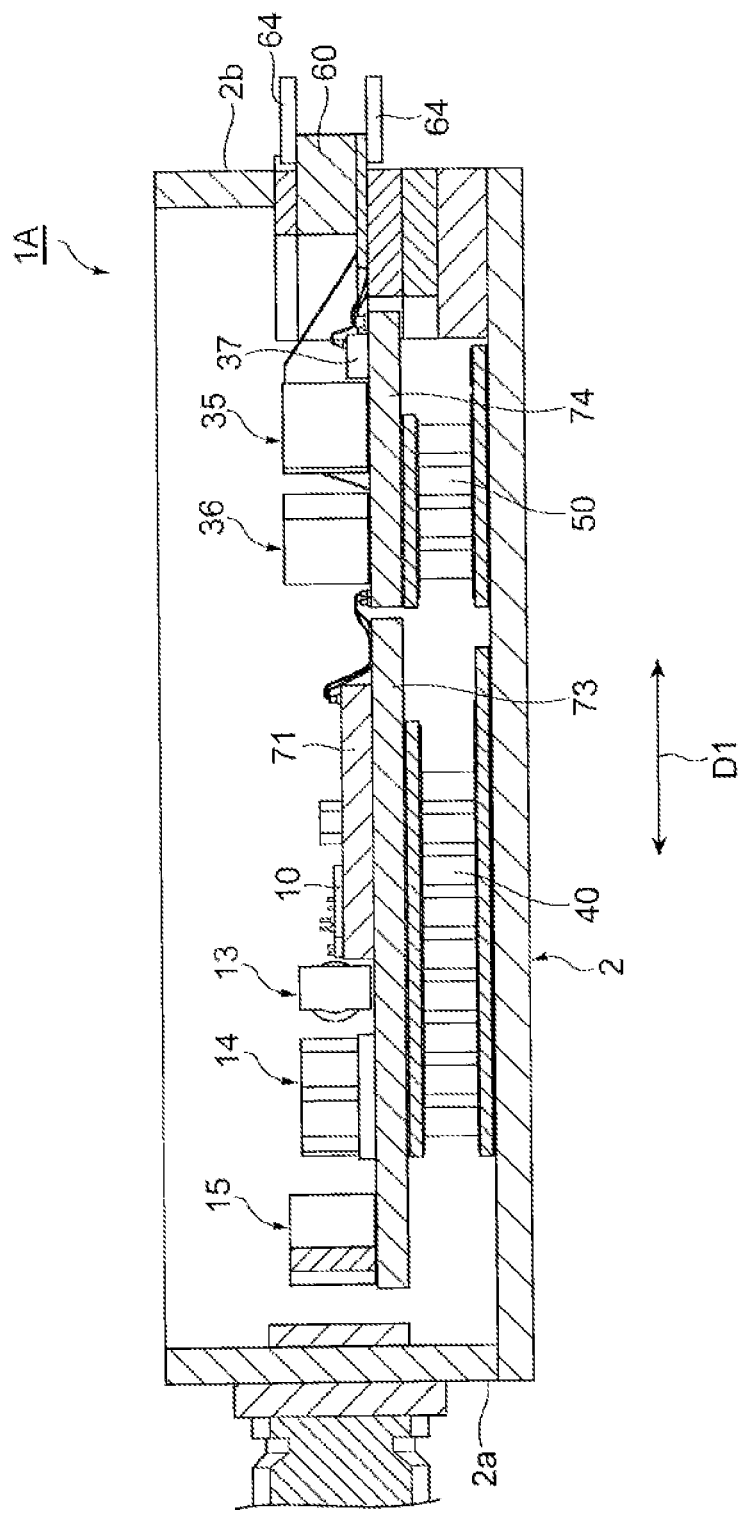
FIG. 3 is a sectional view taken along a line III-III shown in FIG. 2.

FIG. 1 is a perspective view showing an internal structure of an optical module 1A according to an embodiment. FIG. 2 is a plan view showing the internal structure of the optical module 1A. FIG. 3 is a sectional view taken along a line III-III shown in FIG. 2. As shown in FIGS. 1 to 3, the optical module 1A includes a hollow package 2 having a substantially cuboid shape. The package 2 is an example of a housing in the present embodiment. The package 2 includes a front wall 2a (first end wall) and a rear wall 2b (second end wall) that are arranged in the front-rear direction (first direction) D1 and that intersect with the front-rear direction D1, and a pair of side walls 2c and 2d along the front-rear direction D1. The pair of side walls 2c and 2d connects the front wall 2a and the rear wall 2b to each other. Components of the optical module 1A are housed inside the package 2, and the package 2 is hermetically sealed by a lid (not shown). The package 2 has a small size (for example, 6.7 mm in width, 4.0 mm in height, 16 mm in length) that can be mounted on a CFP4 standard transceiver.

The front wall 2a of the package 2 is provided with an optical output port 61 (first optical output port) and an optical output port 62 (second optical output port). The rear wall 2b of the package 2 is provided with a feedthrough 60 having a plurality of external connection terminals 64 such as lead pins. The feedthrough 60 is provided so as to penetrate the rear wall 2b, and electrically connects the inside of the package 2 and the outside of the package 2. A flexible wiring board (FPC) 63 that electrically communicates with the outside is conductively bonded to the plurality of external connection terminals 64 of the feedthrough 60. The electric signal handled by the feedthrough 60 is substantially a DC signal such as a power supply, bias or GND. Therefore, it is not necessary to compensate for high frequency performance at the external connection terminals 64 of the feedthrough 60.

The side walls 2c and 2d of the package 2 extend rearward from the front wall 2a in parallel with each other. The optical module 1A does not have external connection terminals such as lead pins on the side walls 2c and 2d. Furthermore, the outer surfaces of the side walls 2c and 2d are flat without any portion projecting to the outside. As a result, the width of the package 2 can be decreased so that the package 2 can be mounted in a housing of a CFP4 standard optical communication device.

The optical module 1A includes a wavelength tunable laser diode (LD) 10 which is a semiconductor laser element. The wavelength tunable LD 10 is housed in the package 2. The wavelength tunable LD 10 outputs a laser beam L1 from a front surface 11 which is one of light emitting surfaces, and outputs a laser beam L2 from a rear surface 12 which is the other light emitting surface. A collimating lens 13, an isolator 14, an optical axis converter 15, and a monitor photodiode (monitor PD) 16 are provided on the optical path of the laser beam L1. The laser beam L1 output from the front surface 11 of the wavelength tunable LD 10 passes through the collimating lens 13, the isolator 14, and the optical axis converter 15, and then goes to the optical output port 61. The laser beam L1 from the front surface 11 of the wavelength tunable LD 10 is output to the outside of the package 2 through the optical output port 61. When the laser beam L1 is used to generate signal light in a coherent transceiver, a single-mode optical fiber is connected to the optical output port 61.

A collimating lens 21, a wavelength locker unit 30, and an isolator 22 are provided on the optical path of the laser beam L2. The laser beam L2 output from the rear surface 12 of the wavelength tunable LD 10 is converted into collimated light by the collimating lens 21, and after the traveling direction is inverted by a beam splitter 31 and a total reflection mirror 36, the collimated light passes along the side of the wavelength tunable LD 10, and goes to the optical output port 62 through the isolator 22. The laser beam L2 from the rear surface 12 of the wavelength tunable LD 10 is output to the outside of the package 2 through the optical output port 62. When the laser beam L2 is used as local light in the coherent transceiver, a polarization maintaining fiber is connected to the optical output port 62.

The wavelength tunable LD 10 is mounted on a flat sub-mount 71 and housed in the package 2 substantially at the center thereof. The optical axes of the two collimating lenses 13 and 21 are offset from each other. The longitudinal direction of the wavelength tunable LD 10 is inclined at a significant angle other than 0° or 90° with respect to the optical axis of each of the collimating lenses 13 and 21. The laser beams L1 and L2 are emitted from the wavelength tunable LD 10 in parallel with the optical axis of the wavelength tunable LD 10. At this time, the laser beams L1 and L2 are prevented from returning to the wavelength tunable LD 10 by reflection, because the wavelength tunable LD 10 has a significant angle.

The collimating lens 13 converts the laser beam L1 from the wavelength tunable LD 10 into collimated light from divergent light. The isolator 14 allows the laser beam L1 from the collimating lens 13 to pass therethrough, and the optical axis converter 15 offsets the optical axis of the laser beam L1. The optical axis converter 15 includes reflection surfaces 15*a* and 15*b* that are parallel to each other for offsetting the optical axis of the laser beam L1. The reflection surface 15*a* which is one of the reflection surfaces 15*a* and 15*b* has a total reflection film, and the other reflection surface 15*b* has a beam splitter film having a ratio between transmission and reflection of, for example, 5:95 (transmission: 5%, reflection: 95%). The monitor PD 16 monitors the intensity of the laser beam L1. A portion (for example, 5%) of the laser beam L1 passing through the beam splitter film on the reflection surface 15*b* is focused on the monitor PD 16.

The optical module 1A further includes a TEC 40 (first temperature control device) and a carrier member 73. The TEC 40 is equipped with the wavelength tunable LD 10 and controls the temperature of the wavelength tunable LD 10. The carrier member 73 is an example of a second carrier member in the present embodiment. The carrier member 73 is a plate-shaped member having a flat main surface. The carrier member 73 is provided between the wavelength tunable LD 10 and the TEC 40 and functions as a heat sink for radiating heat from the wavelength tunable LD 10. The collimating lenses 13 and 21, the isolators 14 and 22, the optical axis converter 15, the monitor PD 16, and the sub-mount 71 are mounted on the TEC 40 via the carrier member 73.

The optical module 1A further includes a TEC 50 (second temperature control device) and a carrier member 74. The TEC 50 is equipped with the wavelength locker unit 30 and controls the temperature of an etalon filter 35 included in the wavelength locker unit 30. That is, in the present embodiment, the TEC 40 equipped with the wavelength tunable LD 10 and the TEC 50 equipped with the wavelength locker unit 30 are provided independently of each other. The carrier member 74 is an example of a first carrier member in the present embodiment. The carrier member 74 is a plate-shaped member having a flat main surface, and is provided between the wavelength locker unit 30 and the TEC 50. The wavelength locker unit 30 includes two optical splitting components (beam splitters) 31 and 32, two monitor PDs 33 and 34, the etalon filter 35, the total reflection mirror 36 for optical axis conversion, and a thermistor 37. The beam splitters 31 and 32, the monitor PDs 33 and 34, the etalon filter 35, the total reflection mirror 36, and the thermistor 37 are mounted on the TEC 50 via the carrier member 74.

The beam splitters 31 and 32 are optically coupled to the rear surface 12 of the wavelength tunable LD 10 inside the package 2. The laser beam L2 output from the rear surface 12 of the wavelength tunable LD 10 is converted into collimated light by the collimating lens 21, and then enters the beam splitter 31. The beam splitter 31 is a plate beam splitter having a ratio between transmission and reflection of, for example, 5:95 (transmission: 5%, reflection: 95%). The beam splitter 31 reflects most (for example, 95%) of the entering light toward the total reflection mirror 36. However, the beam splitter 31 transmits a small portion (for example, 5%) of the entering light toward the beam splitter 32. The reflectance of the beam splitter 31 is set to 90% (more preferably 95%) or more in order to secure the intensity of the laser beam L2 output to the outside of the package 2. The beam splitter 31 is a plate beam splitter including a dielectric multilayer film provided on a transparent flat plate. Therefore, as compared with a prism beam splitter, the reflectance of the beam splitter 31 can be easily increased, and the cost can be reduced.

The beam splitter 32 splits the light entering from the beam splitter 31. The beam splitter 32 is a plate beam splitter having a ratio between transmission and reflection of, for example, 50:50 (transmission: 50%, reflection: 50%). The beam splitter 32 determines the splitting ratio to the etalon filter 35. The intensity of the laser beam L2 reflected by the beam splitter 32 is detected by the monitor PD 34 after passing through the etalon filter 35. That is, the monitor PD 34 detects the laser beam L2 affected by the transmission characteristic (transmittance) of the etalon filter 35. The intensity of the laser beam L2 passing through the beam splitter 32 is detected by the monitor PD 33 without being affected by the optical components such as the etalon filter 35 having wavelength dependence. The ratio of the intensity of the laser beam L2 detected by the monitor PD 34 to the intensity of the laser beam L2 detected by the monitor PD 33 corresponds to the transmittance of the etalon filter 35. Therefore, the relationship between the transmittance regarding the laser beam L2 and the wavelength dependence of the etalon filter 35 can be grasped, and thus, the deviation of the wavelength of the laser beam L2 from a predetermined output wavelength can be estimated. Then, output signals from the monitor PDs 33 and 34 are fed back to the control signal of the wavelength tunable LD 10 so that the deviation of the wavelength is decreased, whereby the wavelengths of the laser beams L1 and L2 can be locked to arbitrary wavelengths. The monitor PDs 33 and 34 are examples of an optical detection element in the present embodiment.

Figure 4:
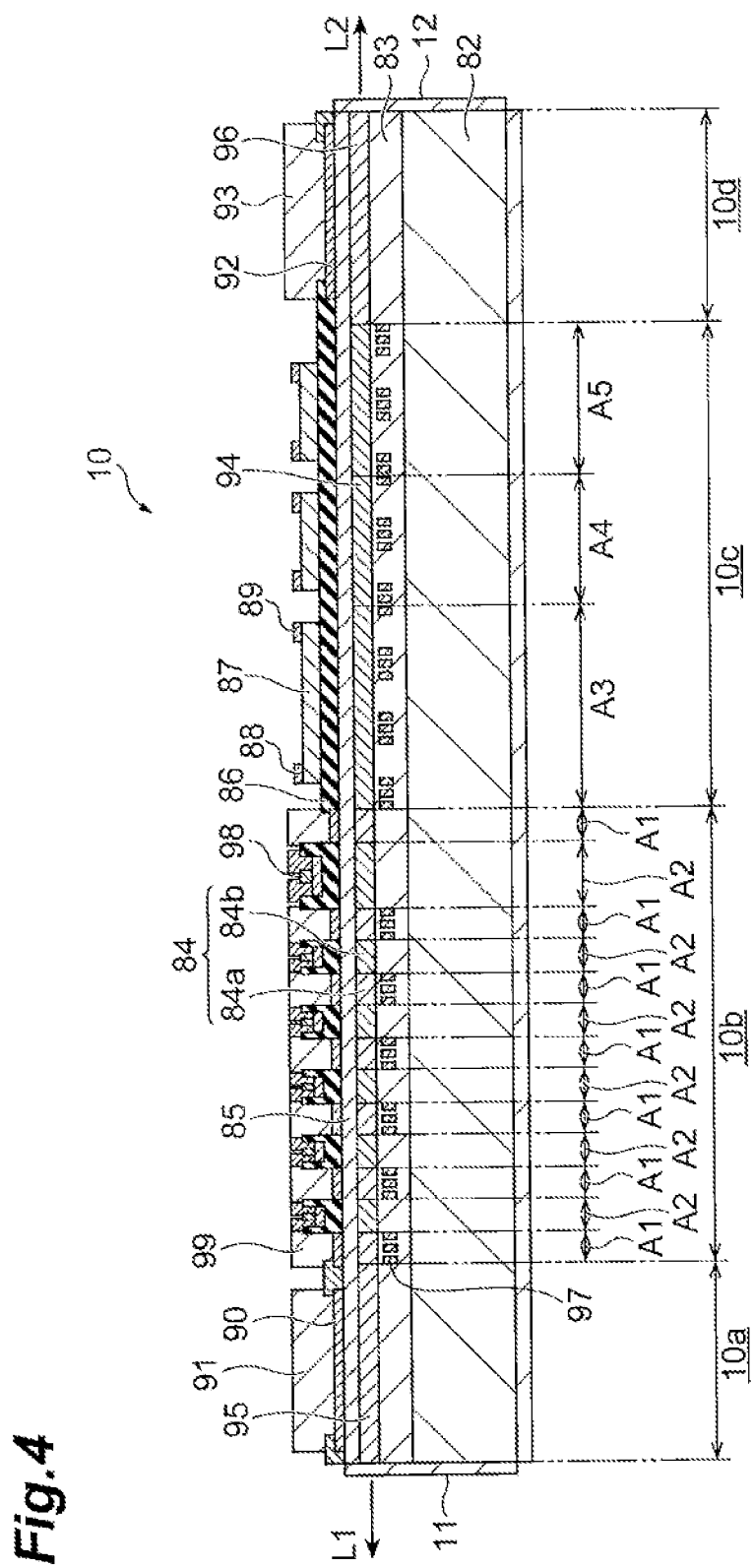
FIG. 4 shows a sectional structure of a wavelength tunable laser diode.

Here, the configuration of the wavelength tunable LD 10 will be described in detail. FIG. 4 shows a sectional structure of the wavelength tunable LD 10. The wavelength tunable LD 10 includes a sampled grating distributed feedBack (SG-DFB) 10b, a chirped sampled grating distributed bragg reflector (CSG-DBR) 10c, and semiconductor optical amplifiers (SOAs) 10a and 10d. The SG-DFB 10b and the CSG-DBR 10c form a resonator, and one wavelength is selected by this resonator. The SG-DFB 10b has a gain and sampled gratings, and the CSG-DBR 10c has sampled gratings. The SG-DFB 10b has a structure in which a lower cladding layer 83 including the sampled gratings, an optical waveguide layer 84, and an upper cladding layer 85 are laminated on a substrate 82. The CSG-DBR 10c has a structure in which the lower cladding layer 83 including the sampled gratings, an optical waveguide layer 94, the upper cladding layer 85, an insulating film 86, and a plurality of heaters 87 are laminated on the substrate 82. Each heater 87 is provided with a power electrode 88 and a ground electrode 89. The SOA 10a has a structure in which the lower cladding layer 83, an active layer 95, the upper cladding layer 85, a contact layer 90, and an electrode 91 are laminated on the substrate 82. The SOA 10d has a structure in which the lower cladding layer 83, an active layer 96, the upper cladding layer 85, a contact layer 92, and an electrode 93 are laminated on the substrate 82.

The optical waveguide layer 84 of the SG-DFB 10b has a structure in which active layers 84a and waveguide layers 84b are alternately arranged along the light propagation direction. Heaters 98 are provided on the upper cladding layer 85 located on the waveguide layer 84b via the insulating film 86. In the SG-DFB 10b and the CSG-DBR 10c, sampled gratings (SG) 97, which are sampling diffraction gratings, are discretely formed in the lower cladding layer 83 at predetermined intervals. The SG-DFB 10b has gain regions A1 and modulation regions A2, and in the gain regions A1, carriers are injected into the active layers 84a from electrodes provided above the gain regions A1. On the other hand, each modulation region A2 has the heater 98 disposed above the modulation region A2, and changes the temperature of the waveguide layer 84b by supplying power to the heater 98. Each SG 97 is composed of regions having a diffraction grating and a region having no diffraction grating therebetween, and shows an optical gain spectrum in which multiple peaks appear at equal intervals in the gain region A1 and the modulation region A2 as a whole. The wavelengths of the peaks and intervals between the peaks can be changed by changing electric power applied to the heater 98 to change the refractive index of the waveguide layer 84b.

The CSG-DBR 10c has three segments A3, A4, and A5. Each of the segments A3, A4, and A5 has the heater 87 and SGs 97 that are independently driven. Due to the action of the SGs 97, the CSG-DBR 10c exhibits a reflection spectrum in which multiple peaks appear discretely. The wavelengths of the peaks and intervals between the peaks can be changed, in the same manner as described above, by changing the refractive index of the optical waveguide layer 94 due to electric power applied to the heaters 87. Note that the temperature of the wavelength tunable LD 10 as a whole may be adjusted by the TEC 40 in order to set the wavelength of one selected peak to a predetermined wavelength. Auto power control (APC) for maintaining the output of the laser beam L1 from the front surface 11 at a predetermined value is enabled by feeding back the output of the monitor PD 16 to the bias of the SOA 10a. Further, APC for maintaining the output of the laser beam L2 from the rear surface 12 at a predetermined value is enabled by feeding back the output of the monitor PD 33 to the bias of the SOA 10d.

Figure 5:
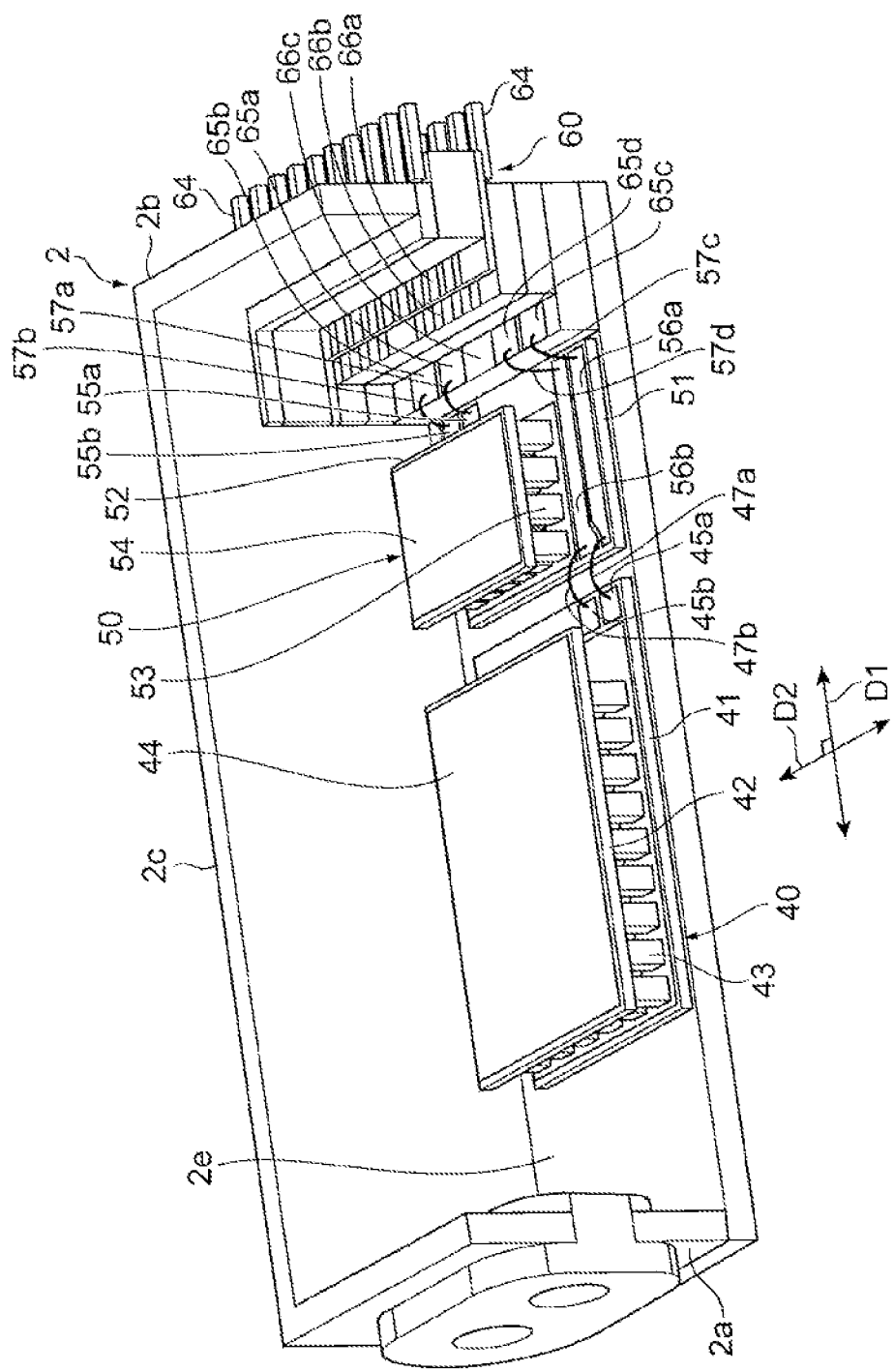
FIG. 5 is a perspective view showing an arrangement of TECs in a package.

FIG. 5 is a perspective view showing the arrangement of the TEC 40 and the TEC 50 in the package 2. As shown in FIG. 5, the TEC 40 and the TEC 50 are arranged side by side in the front-rear direction D1 between the front wall 2a and the rear wall 2b. Specifically, the front wall 2a, the TEC 40, the TEC 50, and the rear wall 2b are arranged in this order. In other words, in relation to the front-rear direction D1, the TEC 40 is arranged between the front wall 2a and the TEC 50, and the TEC 50 is arranged between the TEC 40 and the rear wall 2b.

The TEC 40 is, for example, a Peltier element. The TEC 40 has a substrate 41 (first substrate), a substrate 42 (second substrate), and a heat transfer part 43. The substrate 41 is a plate-shaped member and is fixed to the bottom surface 2e of the package 2 so as to be thermally coupled to the bottom surface 2e. The substrate 42 is joined to the carrier member 73 (see FIGS. 1 to 3) via a metal adhesive 44, and is thermally coupled to the wavelength tunable LD 10 via the metal adhesive 44 and the carrier member 73. The heat transfer part 43 is disposed between the substrate 41 and the substrate 42 and transfers heat between the substrates 41 and 42 by receiving electric power supplied from the outside of the optical module 1A. Terminals (bonding pads) 45a and 45b for receiving electric power supplied from the outside of the optical module 1A are provided on the surface of the substrate 41 reverse to the bottom surface 2e. The terminals 45a and 45b are arranged along the edge of the substrate 41 on the rear wall 2b side, and are arranged side by side in the width direction (second direction) D2 intersecting the front-rear direction D1. The terminals 45a and 45b are metal films formed on the substrate 41.

The TEC 50 is, for example, a Peltier element. The TEC 50 has a substrate 51 (first substrate), a substrate 52 (second substrate), and a heat transfer part 53. The substrate 51 is a plate-shaped member and is fixed to the bottom surface 2e of the package 2 so as to be thermally coupled to the bottom surface 2e. The substrate 52 is joined to the carrier member 74 (see FIGS. 1 to 3) via a metal adhesive 54, and is thermally coupled to the etalon filter 35 (see FIGS. 1 to 3) via the metal adhesive 54 and the carrier member 74. The area of the substrate 51 is larger than the area of the substrate 52. The width of the substrate 51 in the direction D2 is longer than the width of the substrate 52 in the direction D2. The heat transfer part 53 is disposed between the substrate 51 and the substrate 52 and transfers heat between the substrates 51 and 52 by receiving electric power supplied from the outside of the optical module 1A. Terminals (bonding pads) 55a and 55b for receiving electric power supplied from the outside of the optical module 1A are provided on the surface of the substrate 51 reverse to the bottom surface 2e. The terminals 55a and 55b are arranged along the edge of the substrate 51 on the rear wall 2b side, and are arranged side by side in the width direction D2. The terminals 55a and 55b are metal films formed on the substrate 51.

Two wiring patterns (wiring pattern 56a and wiring pattern 56b) for supplying electric power from the feedthrough 60 to the TEC 40 are further provided on the substrate 51 of the TEC 50. The wiring patterns 56a and 56b are metal films formed on the substrate 51. The wiring patterns 56a and 56b are arranged side by side with the heat transfer part 53 in the width direction D2. In other words, the wiring pattern 56a and the wiring pattern 56b are arranged between the heat transfer part 53 and the side wall 2d (see FIGS. 1 and 2) in the width direction D2. The wiring patterns 56a and 56b extend along the front-rear direction D1 and are arranged side by side in the width direction D2. One end of the wiring pattern 56a in the front-rear direction D1 is electrically connected to the terminal 45a of the TEC 40 via a bonding wire 47a. One end of the wiring pattern 56b in the front-rear direction D1 is electrically connected to the terminal 45b of the TEC 40 via a bonding wire 47b.

The feedthrough 60 has terminals 65a to 65d for supplying electric power to the TECs 40 and 50 inside the package 2. The package 2 has multiple (three in this embodiment) stepped surfaces 66a to 66c inside the package 2, and the terminals 65a to 65d are provided on the stepped surface 66c which is the closest to the bottom surface 2e of the package 2 from among the stepped surfaces 66a to 66c. Only the terminals 65a to 65d are provided on the stepped surface 66c, and other terminals are not provided thereon. Each of the terminals 65a to 65d is electrically connected to any of the plurality of external connection terminals 64 inside the feedthrough 60. The other end of the wiring pattern 56a in the front-rear direction D1 is electrically connected to the terminal 65c of the feedthrough 60 via a bonding wire 57c. The other end of the wiring pattern 56b in the front-rear direction D1 is electrically connected to the terminal 65d of the feedthrough 60 via a bonding wire 57d. The terminal 55a of the TEC 50 is electrically connected to the terminal 65a of the feedthrough 60 via a bonding wire 57a. The terminal 55b of the TEC 50 is electrically connected to the terminal 65b of the feedthrough 60 via a bonding wire 57b.

Figure 6:
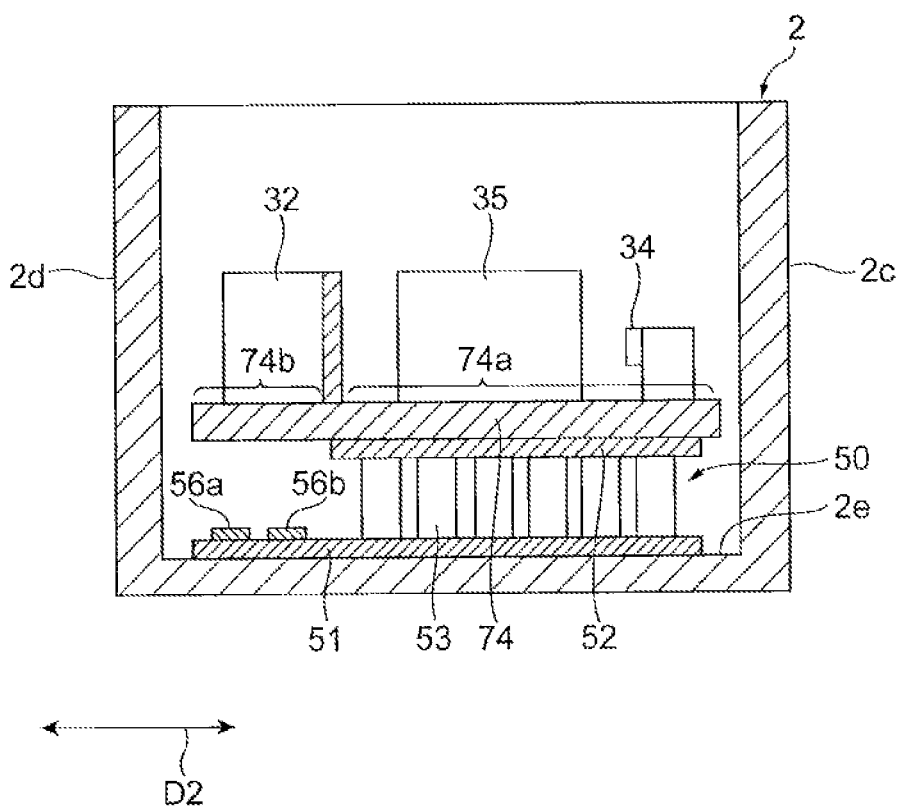
FIG. 6 is a sectional view taken along a line VI-VI shown in FIG. 2.

FIG. 6 is a sectional view taken along a line VI-VI shown in FIG. 2. As shown in FIG. 6, the carrier member 74 has a region 74a (first region) and a region 74b (second region) arranged in the width direction D2. The region 74a is provided on the heat transfer part 53, and the etalon filter 35 is mounted in the region 74a. The region 74b does not overlap with the heat transfer part 53 when viewed in the normal direction of the bottom surface 2e, and faces the wiring patterns 56a and 56b. That is, there is a gap between the region 74b and the substrate 51. The beam splitters 31 and 32 and the monitor PD 33 are disposed in the region 74b. The rear surface 12 (see FIG. 2) of the wavelength tunable LD 10 and the region 74b are arranged side by side in the front-rear direction D1.

Figure 7:
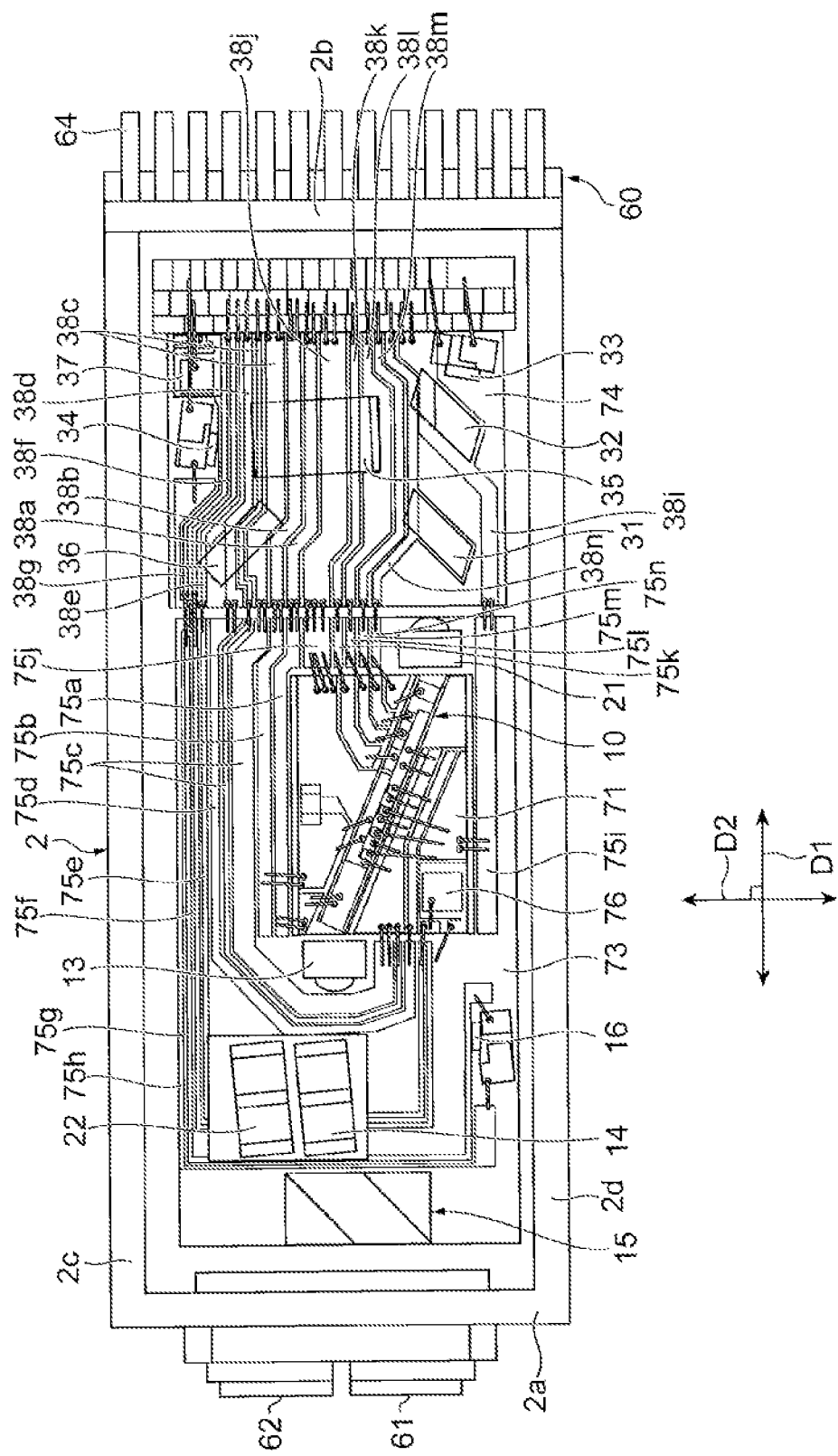
FIG. 7 is a plan view showing a layout of wirings provided on a carrier member.

FIG. 7 is a plan view showing a layout of wirings provided on the carrier members 73 and 74. As shown in FIG. 7, multiple wiring patterns 38a to 38n are provided on the carrier member 74. Among these wiring patterns, the wiring patterns 38a to 38d and 38i to 38n are first wiring patterns for electrically connecting the feedthrough 60 and the wavelength tunable LD 10. The wiring patterns 38a to 38n extend substantially along the front-rear direction D1 and are arranged side by side in the width direction D2. One ends of the wiring patterns 38a to 38n in the front-rear direction D1 are electrically connected to a plurality of terminals provided on the stepped surfaces 66a and 66b of the feedthrough 60, respectively, via bonding wires. The wiring patterns 38a to 38n are metal films formed on the carrier member 74.

Multiple wiring patterns 75a to 75n are provided on the carrier member 73. Among these wiring patterns, the wiring patterns 75a to 75d and 75i to 75n are second wiring patterns for electrically connecting the wiring patterns 38a to 38d and 38i to 38n and the wavelength tunable LD 10. One ends of the wiring patterns 75a to 75n are electrically connected to the other ends of the wiring patterns 38a to 38n, respectively, via bonding wires. The other ends of the wiring patterns 75a to 75d are electrically connected to the wavelength tunable LD 10 via the wiring patterns on the sub-mount 71. The other ends of the wiring patterns 75i to 75n are electrically connected to the wavelength tunable LD 10 via the wiring patterns on the sub-mount 71.

Specifically, the other end of the wiring pattern 75a is electrically connected to the electrode 91 of the SOA 10a. The other end of the wiring pattern 75b is electrically connected to the electrode 99 of the SG-DFB 10b. The other ends of the wiring patterns 75c are electrically connected to the ground electrodes of the heaters 98 and the ground electrodes 89 of the heaters 87. The other end of the wiring pattern 75d is electrically connected to the power electrode of the heater 98 located closest to the CSG-DBR 10c. The other end of the wiring pattern 75i is electrically connected to the power electrodes of the other heaters 98. The other ends of the wiring patterns 75k, 75l, and 75m are electrically connected to the power electrodes 88 of different heaters 87, respectively. The other end of the wiring pattern 75n is electrically connected to the electrode 93 of the SOA 10d.

The other ends of the wiring patterns 75e and 75f are electrically connected to the thermistor 76 provided on the sub-mount 71. The other ends of the wiring patterns 75g and 75h are electrically connected to a pair of terminals of the monitor PD 16 via a wiring pattern on a sub-mount on which the monitor PD 16 is mounted. The wiring patterns 75a to 75n are metal films formed on the carrier member 73.

On the carrier member 73, the wiring patterns 75a to 75h extend along the front-rear direction D1 in the region between the sub-mount 71 and the side wall 2c, and extend around to the front of the sub-mount 71 in the region between the sub-mount 71 and the front wall 2a. The optical path (see FIG. 2) extending from the rear surface 12 of the wavelength tunable LD 10 to the optical output port 62 passes through the space above at least some of the wiring patterns 75a to 75d connected to the wavelength tunable LD 10.

Further, on the carrier member 74, the etalon filter 35 is mounted over the wiring patterns 38a to 38c and the wiring patterns 38j to 38m. In other words, the etalon filter 35 overlaps with the wiring patterns 38a to 38c and the wiring patterns 38j to 38m when viewed in the thickness direction of the carrier member 74. The etalon filter 35 is made of an insulating material. Therefore, even if the etalon filter 35 is provided over the plurality of wiring patterns as described above, the plurality of wiring patterns is not short-circuited with each other. On the other hand, the monitor PDs 33 and 34 do not overlap with the wiring patterns 38a to 38n. Specifically, the sub-mounts on which the monitor PDs 33 and 34 are mounted do not overlap with the wiring patterns 38a to 38n.

The effects obtained by the optical module 1A according to the present embodiment described above will be described. In this optical module 1A, the feedthrough 60 having the external connection terminals 64 for electrically connecting the inside of the package 2 and the outside of the package 2 is provided on the rear wall 2b, and the external connection terminal 64 is not provided to the pair of side walls 2c and 2d. Therefore, the size of the optical module 1A in the width direction D2 can be reduced.

When the TEC 50 is mounted between the TEC 40 and the rear wall 2b, the power supply from the feedthrough 60 provided on the rear wall 2b to the TEC 40 and the electrical connection between the feedthrough 60 and the wavelength tunable LD 10 are problems to be addressed. Commonly, the feedthrough is connected to TEC and LD via a bonding wire. If the bonding wire is extended across the TEC 50 and the carrier member 74, the bonding wire may become too long, and therefore, a failure such as a short circuit is likely to occur. In view of this, in the optical module 1A according to the present embodiment, the wiring patterns 56a and 56b for supplying electric power from the feedthrough 60 to the TEC 40 are arranged side by side with the heat transfer part 53 of the TEC 50 in the direction D2. Due to the wiring patterns 56a and 56b provided as described above, electric power can be suitably supplied from the feedthrough 60 to the TEC 40. The wiring patterns 38a to 38d and 38i to 38n connecting the feedthrough 60 and the wavelength tunable LD 10 are formed on the carrier member 74. As a result, the electrical connection between the feedthrough 60 and the wavelength tunable LD 10 can be suitably established. Furthermore, the reliability of the optical module 1A can be improved as compared with the case where the bonding wire is extended across the TEC 50.

In addition, in a configuration in which the carrier member on the TEC equipped with the LD and the feedthrough are connected only via the bonding wire as in a conventional optical module, if the temperature of the feedthrough varies with a change in ambient temperature, an amount of heat transferred via the bonding wire may vary, which may affect the temperature of the LD. In addition, the power consumption of the TEC equipped with the LD also varies. On the other hand, in the present embodiment, another TEC 50 is mounted between the TEC 40 equipped with the wavelength tunable LD 10 and the feedthrough 60, and the carrier member 73 on the TEC 40 and the feedthrough 60 are connected via the carrier member 74 on the TEC 50. In this case, when the temperature of the feedthrough 60 varies, an amount of heat transferred to the carrier member 74 also varies. However, a variation in the amount of heat transferred to the carrier member 73 can be suppressed by making the temperature of the carrier member 74 substantially constant. Accordingly, an influence of the temperature variation of the feedthrough 60 on the temperature of the wavelength tunable LD 10 can be reduced.

Further, in the above optical module 1A, the wiring patterns 56a and 56b may be provided on the substrate 51 as in the present embodiment. With this configuration, the wiring patterns 56a and 56b can be easily arranged side by side with the heat transfer part 53. Moreover, the wiring patterns 56a and 56b can be easily formed when the optical module 1A is assembled.

Further, the carrier member 74 has the region 74a provided on the heat transfer part 53 and the region 74b facing the wiring patterns 56a and 56b as described in the present embodiment. The etalon filter 35 may be disposed in the region 74a, and the beam splitters 31 and 32 may be disposed in the region 74b. Due to the configuration in which the etalon filter 35 that requires temperature control is mounted over the heat transfer part 53 and the beam splitters 31 and 32 that do not require temperature control are mounted in the region 74b facing the wiring patterns 56a and 56b as described above, the optical module 1A can be further downsized by efficiently arranging the components of the wavelength locker unit 30.

Further, the rear surface 12 of the wavelength tunable LD 10 may be arranged side by side with the region 74b in the direction D1, as in the present embodiment. As a result, the rear surface 12 of the wavelength tunable LD 10 and the beam splitter 31 of the wavelength locker unit 30 can be directly optically coupled without using another optical component. Therefore, the number of optical components of the wavelength locker unit 30 can be reduced, which can contribute to further reduction in size of the optical module 1A.

Further, the feedthrough 60 may have a plurality of stepped surfaces 66a to 66c inside the package 2, and the stepped surface 66c which is the closest to the bottom surface 2e of the package 2 from among the stepped surfaces 66a to 66c may be provided with only the terminals 65a to 65d for supplying electric power to the TECs 40 and 50, as in the present embodiment. With this configuration, the wiring patterns 56a and 56b provided on the substrate 51 of the TEC 50 can be brought closer to the terminals 65a to 65d of the feedthrough 60 in the height direction, which can facilitate the electric connection (wire bonding) between them.

Further, the optical path extending from the rear surface 12 of the wavelength tunable LD 10 to the optical output port 62 may pass over the wiring patterns 75a to 75d and 75i to 75n as in the present embodiment. As a result, the space above the wiring patterns 75a to 75d and 75i to 75n can be effectively used, whereby the optical module 1A can be further downsized.

Further, the etalon filter 35 may be mounted over the wiring patterns 38a to 38c and the wiring patterns 38j to 38m as in the present embodiment. This makes it possible to reduce the area of the carrier member 74, thereby being capable of further downsizing the optical module 1A.

Further, the monitor PDs 33 and 34 may not overlap with the wiring patterns 38a to 38n as in the present embodiment. Each of the monitor PDs is provided with a metal pattern (not shown) on the surface that contacts the back surface of the carrier, and this metal pattern may come into contact with the wiring patterns 38a to 38n. Due to the configuration in which the monitor PDs 33 and 34 do not overlap with the wiring patterns 38a to 38n as described above, an occurrence of short circuit failure can be prevented.

The optical module according to the present disclosure is not limited to the embodiment described above, and various modifications are possible. For example, while the above embodiment describes the wavelength tunable LD as one example of the semiconductor laser element, the present disclosure is not limited thereto, and the present disclosure may be applied to a semiconductor laser element having a constant wavelength.

REFERENCE SIGNS LIST

1A Optical module
2 Package
2a Front wall
2b Rear wall
2c, 2d Side wall
2e Bottom surface
10 Wavelength tunable LD
10a SOA 10b SG-DFB
10c CSG-DBR
10d SOA
11 Front surface
12 Rear surface
13, 21 Collimating lens
14, 22 Isolator
15 Optical axis converter
15a, 15b Reflection surface
16 Monitor PD
30 Wavelength locker unit
31, 32 Beam splitter
33, 34 Monitor PD
35 Etalon filter
36 Total reflection mirror
37 Thermistor
38a to 38n Wiring pattern
40, 50 TEC
41, 42, 51, 52 Substrate
43, 53 Heat transfer part
44, 54 Metal adhesive
45a, 45b, 55a, 55b Terminal
47a, 47b Bonding wire
56a, 56b Wiring pattern
57a to 57d Bonding wire
60 Feedthrough
61, 62 Optical output port
63 FPC
64 External connection terminal
65a to 65d Terminal
66a to 66c Stepped surface
71 Sub-mount
73, 74 Carrier member
75a to 75n Wiring pattern
76 Thermistor
82 Substrate
83 Lower cladding layer
84 Optical waveguide layer
84a Active layer
84b Waveguide layer
85 Upper cladding layer
86 Insulating film
87 Heater
88 Power electrode
89 Ground electrode
90, 92 Contact layer
91, 93 Electrode
94 Optical waveguide layer
95, 96 Active layer
98 Heater
A1 Gain region
A2 Modulation region
A3, A4, A5 Segment
D1 Front-rear direction
D2 Width direction
L1, L2 Laser beam

The invention claimed is:

1. An optical module comprising:
a housing having first and second end walls arranged in a first direction and intersecting with the first direction, and a pair of side walls along the first direction;
a semiconductor laser element housed in the housing;
a first temperature control device equipped with the semiconductor laser element and configured to control a temperature of the semiconductor laser element;
a wavelength locker unit including an optical splitting component and an etalon filter, the optical splitting component and the etalon filter being optically coupled to the semiconductor laser element in the housing; and
a second temperature control device equipped with the wavelength locker unit and configured to control a temperature of the etalon filter, wherein
the first end wall is provided with an optical output port for outputting a laser beam from the semiconductor laser element to an outside of the housing,
the second end wall is provided with a feedthrough having an external connection terminal, the feedthrough being configured to electrically connect an inside of the housing and an outside of the housing,
the pair of side walls is not provided with an external connection terminal,
the second temperature control device is disposed between the first temperature control device and the second end wall in the first direction, and includes a first substrate thermally coupled to a bottom surface of the housing, a second substrate thermally coupled to the etalon filter, and a heat transfer part configured to transfer heat between the first substrate and the second substrate, and
the second temperature control is further provided with a wiring pattern arranged side by side with the heat transfer part in a second direction intersecting with the first direction, and supplying electric power from the feedthrough to the first temperature control device,
wherein the wiring pattern is provided on the first substrate,
further comprising a carrier member disposed between the second temperature control device and the wavelength locker unit and equipped with the wavelength locker unit,
wherein the carrier member has a first region formed on the heat transfer part and a second region facing the wiring pattern, and
the etalon filter is disposed in the first region, while the optical splitting component is disposed in the second region.

2. The optical module according to claim 1, wherein
the optical splitting component is optically coupled to a rear surface of the semiconductor laser element, and
the rear surface of the semiconductor laser element is arranged side by side with the second region in the first direction.

3. An optical module comprising:
a housing having first and second end walls arranged in a first direction and intersecting with the first direction, and a pair of side walls along the first direction;
a semiconductor laser element housed in the housing;
a first temperature control device equipped with the semiconductor laser element and configured to control a temperature of the semiconductor laser element;
a wavelength locker unit including an optical splitting component and an etalon filter, the optical splitting component and the etalon filter being optically coupled to the semiconductor laser element in the housing; and
a second temperature control device equipped with the wavelength locker unit and configured to control a temperature of the etalon filter, wherein
the first end wall is provided with an optical output port for outputting a laser beam from the semiconductor laser element to an outside of the housing,
the second end wall is provided with a feedthrough having an external connection terminal, the feedthrough being configured to electrically connect an inside of the housing and an outside of the housing, the pair of side walls is not provided with an external connection terminal, the second temperature control device is disposed between the first temperature control device and the second end wall in the first direction, and includes a first substrate thermally coupled to a bottom surface of the housing, a second substrate thermally coupled to the etalon filter, and a heat transfer part configured to transfer heat between the first substrate and the second substrate, and the second temperature control is further provided with a wiring pattern arranged side by side with the heat transfer part in a second direction intersecting with the first direction, and supplying electric power from the feedthrough to the first temperature control device, wherein the wiring pattern is provided on the first substrate, wherein the feedthrough has a plurality of stepped surfaces inside the housing, and a stepped surface included in the plurality of stepped surfaces and closest to the bottom surface of the housing is provided with only a terminal for supplying electric power to the first and second temperature control devices.

* * * * *